US008200461B2

(12) United States Patent
Fang (10) Patent No.: US 8,200,461 B2
(45) Date of Patent: Jun. 12, 2012

(54) SMALL-SIGNAL STABILITY ANALYSIS AT TRANSIENT TIME POINTS OF INTEGRATED CIRCUIT SIMULATION

(75) Inventor: Gang Peter Fang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 411 days.

(21) Appl. No.: 12/566,457

(22) Filed: Sep. 24, 2009

(65) Prior Publication Data

US 2011/0071812 A1 Mar. 24, 2011

(51) Int. Cl.
G06F 17/50 (2006.01)
G06F 19/00 (2011.01)
(52) U.S. Cl. ............... 703/2; 703/17; 327/332; 702/58
(58) Field of Classification Search .......... 703/2, 17; 327/332; 702/58
See application file for complete search history.

(56) References Cited

U.S. PATENT DOCUMENTS

| 6,842,714 | B1 * | 1/2005 | Acar et al. | 702/136 |
| 7,124,041 | B1 * | 10/2006 | Johnson et al. | 702/58 |
| 2006/0279349 | A1 * | 12/2006 | Grudin et al. | 327/334 |

OTHER PUBLICATIONS

Middlebrook, "Measurement of loop gain in feedback systems", Int. J. Electronics, vol. 38, No. 4 (1975), pp. 485-512.
Tian et al., "Striving for Small-Signal Stability", Circuits and Devices (IEEE, Jan. 2001), pp. 31-41.
Milev et al., "A Tool and Methodology for AC-Stability Analysis of Continuous-Time Closed-Loop Systems", Proc. of the Design, Automation and Test in Europe Conference and Exhibition (IEEE Computer Society, 2005).
U.S. Appl. No. 61/242,222, filed Sep. 14, 2009.
Kundert, The Designers Guide to SPICE and SPECTRE (Kluwer Academic Publishers, 1995), pp. 66-107.

* cited by examiner

*Primary Examiner* — Thai Phan
(74) *Attorney, Agent, or Firm* — Jacqueline J. Garner; Wade J. Brady, III; Frederick J. Telecky, Jr.

(57) ABSTRACT

Simulation method and system for analyzing the stability of a modeled electronic circuit. Simulation of the transient response to a desired input stimulus is performed in a piecewise fashion, in a sequence of transient time points. At one or more user-specified time points ("tpunch" points) within the transient interval, the state of the circuit in the transient response at that time point is applied to the model as if it were a DC operating point, and the small-signal stability of the circuit under those conditions is analyzed. Transient instability of the circuit is thus discovered by way of simulation, allowing the designer to determine the cause and cure of that instability.

18 Claims, 5 Drawing Sheets

SMALL-SIGNAL STABILITY ANALYSIS AT TRANSIENT TIME POINTS OF INTEGRATED CIRCUIT SIMULATION

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of simulation of integrated circuits. Embodiments of this invention are more specifically directed to small-signal stability analysis in such simulation of integrated circuits.

Simulation of the operation of electronic circuits is a staple task in the design of integrated circuits, especially as integrated circuit functionality and complexity have increased over time. Modern circuit simulation tools not only allow the circuit designer to ensure that the circuit carries out the intended function, but also enable the designer to evaluate the robustness of circuit operation over variations in temperature, signal levels, power supply voltages, and process parameters. Such simulation is useful in evaluating the performance of designed circuits prior to their manufacture, to validate the design prior to the expense of obtaining photomasks and building live devices. In addition, such simulation is useful in providing detailed understanding of the cause of and cures for circuit weaknesses that are observed from the test or operation of actual integrated circuit devices.

A well-known circuit simulation program is the Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

According to SPICE-based circuit simulators, the circuit being simulated is expressed in terms of its elements such as resistors, transistors, capacitors, and the like. Each circuit element is associated with a mathematical model of its behavior (i.e., response to voltage or current stimuli). These models are "connected" into an overall circuit description by specifying the circuit nodes to which each modeled circuit element is connected. The resulting circuit description essentially consists of a system of equations that can be numerically solved. In modern circuits, these equations are typically in the form of nonlinear differential equations, with interconnections of the modeled circuit elements specified by equations derived from the well-known Kirchhoff voltage and current laws. Typically, a system of nonlinear differential equations solved by SPICE-based or SPICE-like simulation programs is expressed as:

$$\frac{d}{dt}\bar{q}(\bar{v}(t)) + \bar{i}(\bar{v}(t)) + \bar{u}(t) = 0 \tag{1}$$

where $\bar{v}$ is a solution vector consisting of node voltages and branch currents in the circuit, $\bar{q}$ represents a vector of node charges, $\bar{i}$ is a vector of currents flowing out of nodes, and $\bar{u}u$ is a user-defined stimulus.

"Analysis" refers to the solution of these equations in the circuit description in response to a set of inputs or initial conditions (voltages, currents, stored charge etc.), for one or more selected variables or nodes of interest at which the circuit response is to be analyzed. The types of analyses available within modern circuit simulation environments include DC analysis, "small-signal" analyses such as AC analysis, and transient analysis, among others. Other analyses of the circuit, for example noise analysis, transfer function analysis, and the like, can also be performed via such simulation.

DC analysis essentially solves the system of nonlinear equations (1) to identify a steady-state operating point of the simulated circuit. Because the time-derivative term is zero in the steady-state, the system of equations (1) becomes:

$$\bar{i}(\bar{v}_{DC}) + \bar{u}_{DC} = 0 \tag{2}$$

for DC analysis. For AC analysis, the system of equations (1) is solved in response to an input stimulus consisting of a DC component and a small harmonic perturbation:

$$\bar{u}(t) = \bar{u}_{DC} + \bar{u}e^{j\omega t} \tag{3}$$

in which case the solution vector becomes:

$$\bar{v}(t) = \bar{v}_{DC} + \bar{v}_{AC}e^{j\omega t} \tag{4}$$

Substituting the expressions of equations (2) through (4) into the system of equations (1), and applying the small-signal approximation of first order Taylor expansion, the system of equations (1) is expressed, for purposes of performing this AC analysis, as:

$$(\bar{G}_{DC} + j\omega\bar{C}_{DC})\cdot\bar{v}_{AC} + \bar{u}_{AC} = 0 \tag{5}$$

This system of equations (5) is a complex linear system, where $$\bar{G}_{DC} = \frac{\partial \bar{i}}{\partial \bar{v}}(\bar{v}_{DC})$$

and where $$\bar{C}_{DC} = \frac{\partial \bar{q}}{\partial \bar{v}}(\bar{v}_{DC}).$$

Transient analysis determines the time domain response of the circuit to a specified stimulus, over a specified time interval [0, T]. Typically, transient analysis is performed in modern circuit simulation environments by discretizing in time the differential algebraic equations describing the circuit, for example by replacing the time-derivative operator in the differential algebraic equations with a finite-difference approximation. This time discretization effectively converts the system of equations into a system of nonlinear algebraic equations, and that system is then solved in a piece-wise fashion at each of a sequence of discrete time points [0, $t_1$, $t_2$, ... T] within the interval [0, T]. For example, discretization using the backward Euler formula expresses the system of equations (1) as:

$$\frac{\bar{q}(\bar{v}_m) - \bar{q}(\bar{v}_{m-1})}{h_m} + \bar{i}(\bar{v}_m) + \bar{u}_m = 0 \tag{6}$$

where m is the time index, and h is the time step between time points. The system of equations (6) is then solved at each of the discrete time points $t_1$, $t_2$, etc. Various other discretization approaches may be used, including the trapezoidal rule, forward Euler, backward Euler, and second-order backward different formula (Gear's methods). Selection of one of these particular discretization methods is generally based on a trade-off of computational complexity with the desired analysis accuracy.

In conventional transient analysis, solving the system of nonlinear algebraic equations after discretization at each time point, is typically obtained by way of an iterative solution algorithm. A basic approach to the solution of these equations is the well-known Newton-Raphson method, which begins from an initial guess for the solution of the nonlinear algebraic equations, linearizes the equations about the initial guess value, and solves the resulting linear system. The linearized equations are represented as a circuit matrix, and conventional LU factorization and forward/backward-substitution approaches are used to obtain the matrix solution. The new solution then becomes the initial guess for a next iteration of the solution process, and the process repeats until convergence criteria are satisfied. The solution of the system at that time point is then stored, and used in the solution of the system of nonlinear algebraic equations at the next time point.

Other types of small-signal analysis available within modern circuit simulation environments and packages include transfer function (XF) analysis, S-parameter (SP) analysis, noise analysis, and the like.

Another type of small signal analysis is referred to in the art as "small-signal stability" analysis, or simply "stability" analysis. As performed by conventional circuit simulation packages, small-signal stability analysis essentially analyzes small-signal properties of feedback (return) loops, for example gain and phase margin, in the circuit being simulated. As known in the art, phase margin is measured as the phase difference of the loop gain from −180° at the unity gain frequency, and gain margin is measured as the gain difference from unity at the frequency at which the loop gain exhibits a −180° phase shift. Conventional methods for performing small-signal stability analysis in the SPICE circuit simulation environment as well as in other simulation environments have been developed.

One approach to analysis of small-signal stability is referred to as "STB" analysis, and is described in Middlebrook, "Measurement of loop gain in feedback systems", *Int. J. Electronics*, Vol. 38, No. 4 (1975), pp. 485-512, incorporated herein by this reference. An extension of the Middlebrook approach is described in Tian et al., "Striving for Small-Signal Stability", *Circuits and Devices* (IEEE, January 2001), pp. 31-41, incorporated herein by this reference. STB analysis is based on a computation of the return ratio T (which corresponds to the loop gain in circuits with ideal loops) of a known feedback loop in the system, as taken at a breakpoint in the feedback loop. This return ratio T is based on two signal-injection-based measurements: a first measurement is a voltage return ratio obtained from applying a test voltage at the breakpoint to null the output current, and a second measurement is a current return ratio obtained from inserting a test current at the breakpoint to null the output voltage. Using the DC circuit matrices $$\bar{G}_{DC} = \frac{\partial \bar{i}}{\partial \bar{v}}(\bar{v}_{DC}) \text{ and } \bar{C}_{DC} = \frac{\partial \bar{q}}{\partial \bar{v}}(\bar{v}_{DC})$$

expressing the system of equations (1) according to the small-signal approximation, as described above, the calculated voltage and current return ratios are combined to calculate the loop return ratio T. Variations on the STB approach are known, such approaches including the computation of the true return ratio by way of a bilateral return-loop model. Implementations of the STB analysis approach in conventional simulation environments provide output results similar to those provided in AC analysis, for example as plots of magnitude and phase of loop gain vs. frequency. Sweeps of other parameters can also be performed at specified frequencies. Phase and gain stability margins (i.e., distances from pole frequencies in terms of gain and phase values) can be computed automatically, as can phase and gain margin frequencies.

While STB analysis has the advantage that there is no DC break in the loop, and all loading effects are accounted for in the computations, STB analysis is applicable only to those feedback loops that are identified a priori in the analysis. As such, STB analysis is of limited use in circuits that have complicated feedback loops in which an ideal breakpoint cannot be readily identified. And STB analysis does not comprehend feedback loops that are "hidden", such as those involving device parasitics.

Another newer approach for stability analysis in the circuit simulation environment is known as the "loop finder" or "LF" approach. One loop finder approach is described in detail in Milev et al., "A Tool and Methodology for AC-Stability Analysis of Continuous-Time Closed-Loop Systems", *Proc. of the Design, Automation and Test in Europe Conference and Exhibition* (IEEE Computer Society, 2005), incorporated herein by this reference. This approach essentially utilizes underdamped continuous-time second-order systems to model overshoot and ringing, extracting the dominant second-order systems from the observed system frequency response. More specifically, an AC-current stimulus is applied to each node of the circuit in sequence, and the AC-voltage response to that stimulus is measured at the same node, using the DC circuit matrices $$\bar{G}_{DC} = \frac{\partial \bar{i}}{\partial \bar{v}}(\bar{v}_{DC}) \text{ and } \bar{C}_{DC} = \frac{\partial \bar{q}}{\partial \bar{v}}(\bar{v}_{DC})$$

described above. A stability plot identifying the dominant complex poles is computed, from which natural frequencies and damping ratios are extracted. Those nodes that share the same complex pole form a loop, and the loop finder tool reports each loop along with their natural frequencies and damping ratios.

An improved approach to the Milev and Burt technique is described in copending and commonly assigned U.S. provisional application No. 61/242,222, filed Sep. 14, 2009, entitled "A Method for Small-Signal Stability Analysis of Analog Circuits", and incorporated herein by reference. According to that approach, the system impedance transfer function at each node is expressed in a pole-residue form, in which all complex poles appear as conjugate pairs (and essentially define a second-order system). Real poles and complex poles with a large damping ratio are ignored, as are second-order systems with low DC impedance. The dominant complex poles for each node transfer function are identified, and those nodes sharing the same dominant complex pole are categorized as forming a loop. The nodes in each loop list are sorted according to their impedance, and gain and phase margins computed as desired.

The loop finder ("LF") approach to small-signal stability analysis is useful in identifying and analyzing local unstable loops, thus overcoming the limitation of STB analysis. The computational requirements for loop finder analysis are substantial, however, especially in dense circuits with a large number of nodes. U.S. provisional application No. 61/242,222, incorporated herein by reference, describes an efficient algorithm that alleviates that computational burden.

In conventional circuit simulation environments, however, these and other stability analysis techniques can be applied only at assumed steady-state operating points. In other words, the various circuit nodes and parameters in the circuit being modeled are defined at steady-state conditions, and stability analysis is performed at those conditions. However, it has been observed, in connection with this invention, that transient effects can greatly vary the impedances (or admittances) and gains of circuit elements in modern integrated circuits. Accordingly, it has been observed, in connection with this invention, that circuits can be unstable at certain frequencies during transient events, and that such instability can become manifest as circuit failure during operation of actual live devices. Conventional simulators are unable to provide insight into these transient instabilities.

BRIEF SUMMARY OF THE INVENTION

Embodiments of this invention provide a simulation method and system in which small-signal stability can be evaluated at specific times within the transient response of a circuit.

Embodiments of this invention provide such a method and system in which any one of a number of small-signal stability approaches may be used within the transient response.

Other objects and advantages of embodiments of this invention will be apparent to those of ordinary skill in the art having reference to the following specification together with its drawings.

An embodiment of this invention may be implemented into a method of performing a circuit simulation, and a system programmed to perform such simulation, in which a transient simulation is executed up to a selected time point within the transient response. The simulation results at that time point are saved. Small-signal stability analysis is performed at the selected time point, using the transient simulation results at that time point as a DC operating point of the circuit. The previously-stored transient simulation results are retrieved and applied as initial conditions of the circuit, and the transient simulation is continued forward from that point.

DETAILED DESCRIPTION OF THE INVENTION

The present invention will be described in connection with its preferred embodiment, namely as implemented into a computer system that executes program instructions within a simulation software package for simulating the response of electronic circuits. It is contemplated that this invention will be especially beneficial when used in connection with such an application. However, it is contemplated that this invention can also be used to advantage in other applications, including in the simulation of other systems, whether mechanical or electrical in nature. Accordingly, it is to be understood that the following description is provided by way of example only, and is not intended to limit the true scope of this invention as claimed.

Figure 1:
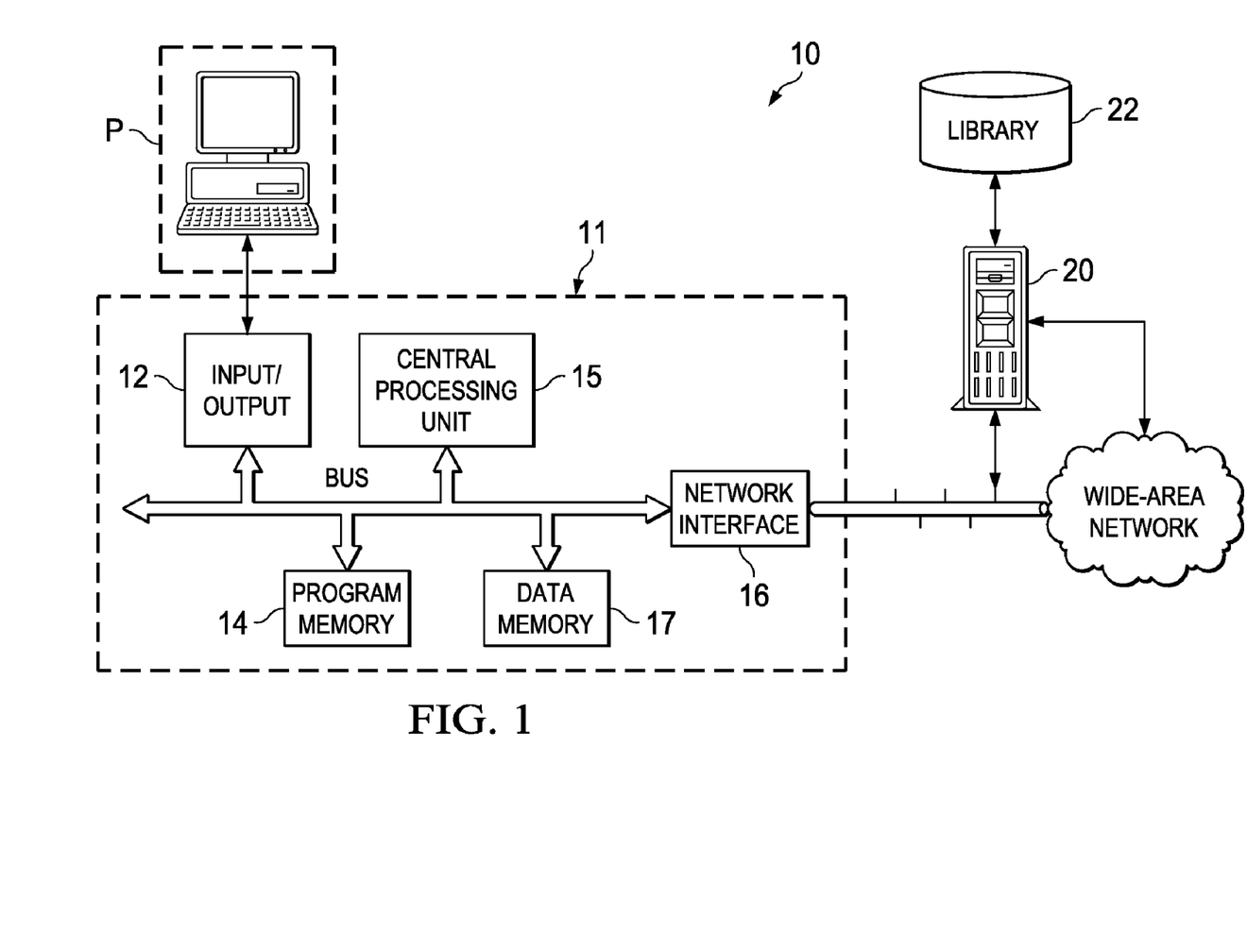
FIG. 1 is an electrical diagram, in schematic form, illustrating a computer system for simulating an integrated circuit to perform stability analysis at points in time during a transient response of the circuit, according to embodiments of the invention.

Referring now to FIG. 1, computing system 10 for performing a simulation of the operation of a modeled electronic circuit, according to embodiments of the invention, will now be described. In this example, simulation system 10 is realized by way of a computer system including workstation 11 connected to server 20 by way of a network. Of course, the particular architecture and construction of a computer system useful in connection with this invention can vary widely. For example, simulation system 10 may be realized by a single physical computer, such as a conventional workstation or personal computer, or alternatively by a computer system implemented in a distributed manner over multiple physical computers. Accordingly, the generalized architecture illustrated in FIG. 1 is provided by way of example only.

As shown in FIG. 1, workstation 11 includes central processing unit 15, coupled to system bus BUS. Also coupled to system bus BUS is input/output interface 12, which refers to those interface resources by way of which peripheral functions P (e.g., keyboard, mouse, display, interfaces to laboratory equipment etc.) interface with the other constituents of workstation 11. Central processing unit 15 refers to the data processing capability of workstation 11, and as such may be implemented by one or more CPU cores, co-processing circuitry, and the like. The particular construction and capability of central processing unit 15 is selected according to the application needs of workstation 11, such needs including, at a minimum, the carrying out of the functions described in this specification, and also including such other functions to be executed by simulation system 10. In the architecture of simulation system 10 according to this example, program memory 14 and data memory 17 are coupled to system bus BUS.

Program memory 14 stores the computer instructions to be executed by central processing unit 15 in carrying out those functions. More specifically, program memory 14 is a computer-readable medium storing executable computer program instructions according to which the operations described in this specification are carried out by simulation system 10, specifically by central processing unit 15 of workstation 11. Alternatively, these computer program instructions may be stored at and executed by server 20, in the form of a "web-based" application, upon input data communicated from workstation 11, to create output data and results that are communicated to workstation 11 for display or output by peripherals P in a form useful to a human user. Data memory 17 provides memory resources of the desired type useful as data memory for storing input data and the results of processing executed by central processing unit 15. Of course, this memory arrangement is only an example, it being understood that data memory 17 and program memory 14 may be included within a unified physical memory resource, or distributed in whole or in part outside of workstation 11. In addition, measurement inputs acquired from laboratory tests and measurements, or as design parameters, can be input into workstation 11 via one of peripherals P and input/output function 12, for storage in a memory resource accessible to workstation 11, either locally or via network interface 16.

Network interface 16 of workstation 11 is a conventional interface or adapter by way of which workstation 11 accesses network resources on a network. As shown in FIG. 1, the network resources to which workstation 11 has access via network interface 16 includes server 20, which resides on a local area network, or a wide-area network such as an intranet, a virtual private network, or over the Internet, and which is accessible to workstation 20 by way of one of those network arrangements and by corresponding wired or wireless (or both) communication facilities. In this embodiment of the invention, server 20 is a computer system, of a conventional architecture similar, in a general sense, to that of workstation 11, and as such includes one or more central processing units, system buses, and memory resources, network interface functions, and the like. Library 22 is also available to server 20 (and perhaps workstation 11 over the local area or wide area network), and stores model and simulation calculations, previous simulation results, actual electrical measurements obtained from integrated circuits for use in correlation with current models, and other archival or reference information useful in simulation system 10. Library 22 may reside on another local area network, or alternatively be accessible via the Internet or some other wide area network. It is contemplated that library 22 may also be accessible to other associated computers in the overall network.

Of course, the particular memory resource or location at which the measurements, library 22, and program memory 14 physically reside can be implemented in various locations accessible to simulation system 10. For example, these data and program instructions may be stored in local memory resources within workstation 11, within server 20, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, program memory 14 stores computer instructions executable by central processing unit 15 to carry out the functions described in this specification, by way of which the behavior of a modeled integrated circuit can be evaluated according to embodiments of this invention. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. For example, it is contemplated that the method of simulating the behavior of an electronic circuit according to embodiments of this invention is especially useful when applied to an electronic circuit simulation using a simulation environment based on the well-known Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

It is contemplated that those skilled in the art having reference to this description will be readily able to realize embodiments of the invention in a manner suitable for particular installations, without undue experimentation. As such, and in the alternative to the locally-stored simulation programs described above, the computer-executable software instructions implementing embodiments of this invention may reside elsewhere on the local area network or wide area network, or be downloadable from higher-level servers or locations by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloaded as encoded information on an electromagnetic carrier signal, for example in the form of a software package from which the computer-executable software instructions were installed by simulation system 10 in the conventional manner for software installation.

Figure 2:
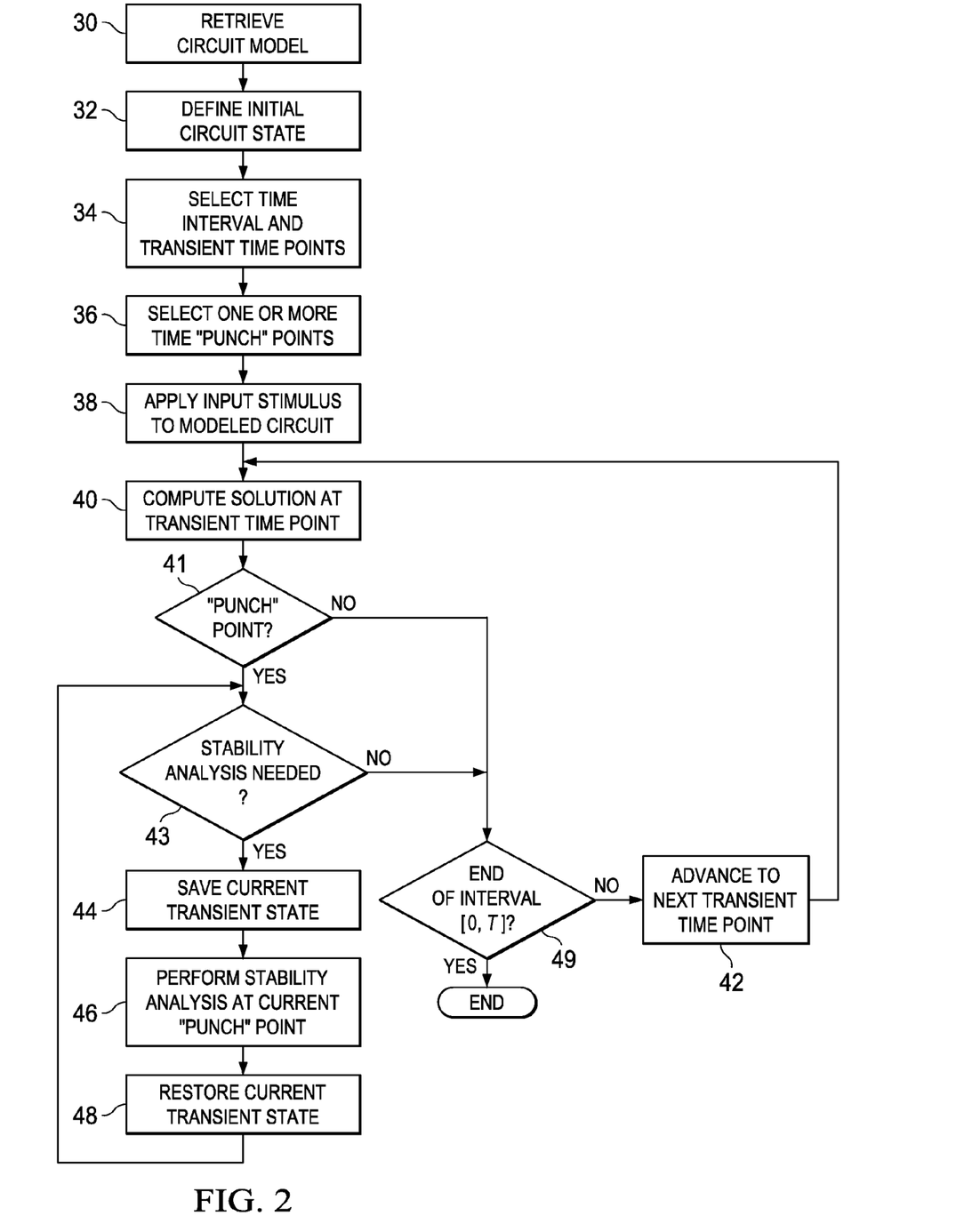
FIG. 2 is a flow diagram illustrating the operation of the simulation system of FIG. 1 according to embodiments of this invention.

Referring to FIG. 2, a method of operating simulation system 10 according to embodiments of this invention will now be described in detail. More specifically, according to embodiments of this invention, computational resources within simulation system 10 execute computer-executable software instructions that are stored within one of its memory resources or that are otherwise available to analyze the small-signal stability of a modeled integrated circuit, at points in time during its transient response to a stimulus. As a result, additional potential instabilities of integrated circuits corresponding to the model can be identified, and addressed by way of changes to the circuit or by identification of process or operational limits, beyond those instabilities that can be identified by conventional modeling and simulation packages.

Those skilled in the art having reference to this specification will readily recognize a wide range of alternatives and variations to the operation of simulation system 10 as described herein. In addition, it is contemplated that each of the process steps performed in connection with this description of the operation of simulation system 10 will be executed, under either user or program control, by the appropriate functions and components of simulation system 10, depending on the particular architecture. For purposes of this description, it is contemplated that this operation of simulation system 10 will be performed by central processing unit 15 of workstation 11 in the execution of program instructions stored in program memory 14 or in some other memory resource of simulation system 10; of course, other computational resources or components within simulation system 10 may alternatively execute these instructions to carry out one or more of the processes illustrated in FIG. 2 and described herein. It is of course contemplated that the specific manner in which simulation system 10 performs these operations can be defined by those skilled in the art having reference to this specification, as appropriate for the particular architecture of simulation system 10 and the desired interface between simulation system 10 and the human user.

As shown in FIG. 2, this method of operating simulation system 10 begins with process 30, in which a current model for the circuit to be analyzed is retrieved from library 22, or from some other memory resource in simulation system 10. As known in the art for SPICE and similar simulation environments, the simulation of an electronic circuit is based on a set of circuit elements that are associated with selected "nodes" in an overall "netlist" that specifies the circuit to be operated according to the desired simulation. Each circuit element is specified by a model that specifies the simulated behavior of that circuit element in response to stimuli applied to that circuit element at its nodes; some nodes in the circuit will serve as inputs to the circuit being simulated, and some nodes will serve as the "output" nodes, namely as the nodes under investigation by the simulation in response to the stimuli applied at the input nodes. It is contemplated that those skilled in the art having reference to this specification will readily comprehend the nature of the circuit model that is stored in library 22 or elsewhere, and that is retrieved by simulation system 10.

In process 32, initial conditions to be applied at nodes of the modeled circuit, for purposes of simulating the transient response of that circuit, are defined by the user of simulation system 10, via peripherals P, or alternatively from a default or other initial state stored in library 22 or another memory resource. In process 34, as typical for transient analysis of the modeled electronic circuit, the time interval over which the transient response is to be analyzed via simulation is selected by the user via peripherals P, or by retrieving a previously stored interval. As discussed above, conventional transient analysis is performed by time discretization over the selected time interval, according to which a system of equations descriptive of the model is then solved in a piece-wise fashion at each of a sequence of discrete time points $[0, t_1, t_2, \ldots T]$ within the interval $[0, T]$. Accordingly, according to this embodiment of the invention, the interval $[0, T]$ is selected in process 34. The discrete transient time points $[0, t_1, t_2, \ldots T]$ within that interval are generally chosen by a time-stepping method, in an on-the-fly manner, based on local truncation errors, break points, and the like. Alternatively, these discrete transient time points may be selected a priori along with the interval in process 34, or may be otherwise specified.

According to embodiments of this invention, small-signal stability analysis is to be performed at one or more user-specified time points (referred to in this description as "tpunch" points) within the transient response interval. Simulation system 10 will place the discrete selected time points $t_1$, $t_2$, etc. on these tpunch points, considering that the instantaneous conditions at the various nodes of the modeled circuit will be applied in performing the small-signal stability analysis at the tpunch points. In process 36, these tpunch points are selected by the user, or retrieved from a memory resource if previously selected and stored for later use.

Figure 3:
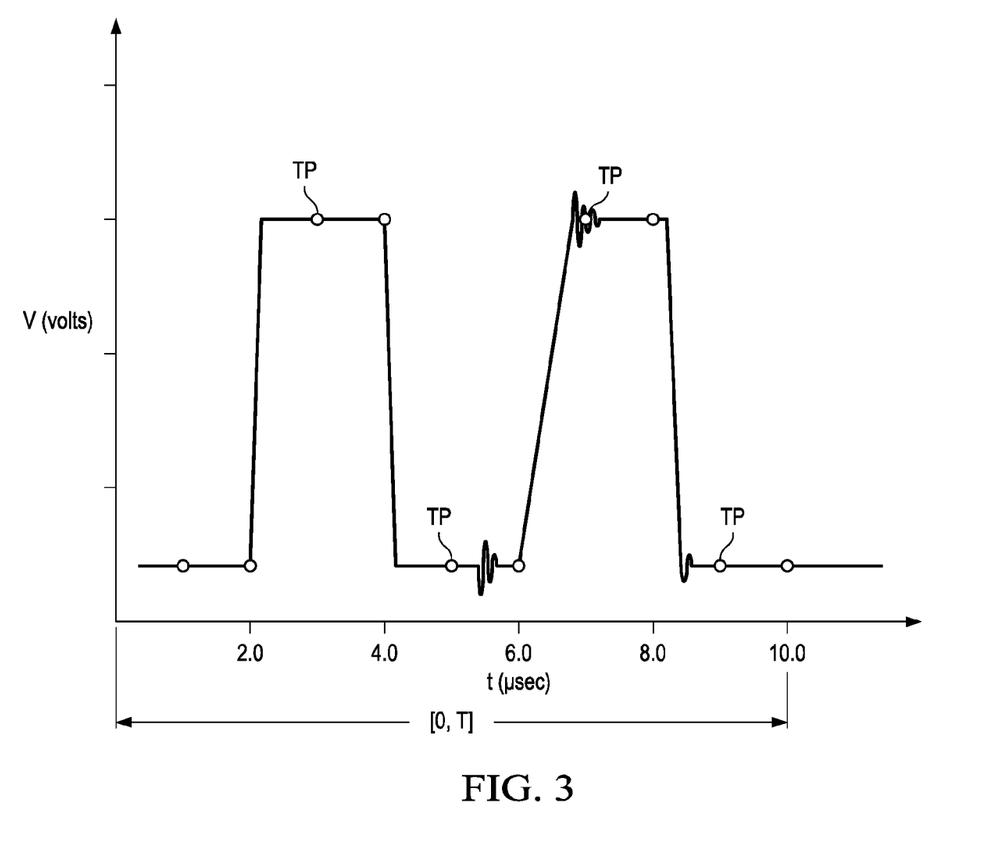
FIG. 3 is a timing diagram illustrating the selection of specified time points (tpunch) at which stability analysis is to be performed, in connection with embodiments of this invention.

FIG. 3 illustrates an example of processes 34 and 36, relative to an output waveform example. In this example of FIG. 3, the time interval $[0, T]$ defined in process 34 extends from 0.0 µsec to 10.0 µsec. As shown in FIG. 3, the tpunch points TP selected in process 36 appear at 3.0, 5.0, 7.0, and 9.0 microseconds; each corresponding to a discrete transient time point selected during the transient analysis simulation. Of course, the user may not be precisely aware of the shape of the waveform (as shown in FIG. 3) at the time of process 36, because the transient analysis has not yet been performed. In many cases, however, the user will likely have some general sense of the expected waveform in response to the input stimulus, based on knowledge of the circuit design or from earlier simulations of the circuit. That general sense can be used in the selection of the tpunch points TP in process 36.

Referring back to FIG. 2, an input stimulus signal is applied to one or more nodes of the circuit being modeled, in process 38. As typical for transient analysis of a modeled circuit in conventional simulation packages, this stimulus is selected by the user or retrieved from a memory resource in process 38, and corresponds to the stimulus for which the simulated transient response at one or more other nodes is to be determined. In process 40, simulation of the modeled electronic circuit begins with the computation of the solution of a system of nonlinear algebraic equations that approximate the differential algebraic equations modeling the circuit being simulated, at the first discrete transient time point $t_1$ in the interval $[0, T]$. As described above, the discretized system of equations solved at a transient time point $t_m$ can be expressed (via the back Euler formula) as:

$$\frac{\overline{q}(\overline{v}_m) - \overline{q}(\overline{v}_{m-1})}{h_m} + \overline{i}(\overline{v}_m) + \overline{u}_m = 0 \quad (6)$$

where m is the time index (i.e., at time $t_1$, m=1), and h is the time step between time points. Because the circuit being modeled is (typically) a multiple-node circuit, solution process 40 solves the system of multiple equations (6) using conventional matrix operations. And because the equations in this system are nonlinear, as known in the simulation art, an iterative method, for example the Newton-Raphson method, is used to solve the nonlinear system. During an iteration, each equation is approximated by a linear representation. The particular methods used to solve the circuit equations or their representations are well known in the art. Upon convergence of the solution of this system of linear approximations to the nonlinear algebraic equations that themselves approximate the differential circuit equations, the set of node voltages and branch currents at transient time point $t_1$ (in this case) constitute the state of the modeled circuit at that point. These results are stored in memory for use in the next stages of the analysis, as will now be described.

Decision 41 is then executed by simulation system 10 to determine whether the current transient time point at which the solution of process 40 was derived corresponds to one of the tpunch points selected in process 36. If not (decision 41 returns a "no"), and if the current transient time point is not already at the end of the interval $[0, T]$ defined in process 34 (decision 49 is "no"); then a counter or pointer indicating the transient time point to be analyzed is advanced, in process 42. Process 40 is then repeated to solve the system of circuit equations (6) at that next discrete transient time point.

If decision 41 determines that the current transient time point is one of the tpunch points (decision 41 is "yes"), then simulation system 10 executes decision 43 to determine whether stability analysis is required at this tpunch point; if not (decision 43 is "no") and if the current transient time point is not already at the end of the interval $[0, T]$ defined in process 34 (decision 49 is "no"), then the transient analysis advances to the next transient time point (process 42), and the transient analysis continues with the next piece-wise solution generated in process 40. If stability analysis is to be performed at this tpunch point (decision 43 is "yes"), then the current transient state recently computed in process 40, for the current transient time point, is saved in memory, in process 44. This saving of the node voltages and branch currents at this current transient time point allows the transient analysis to commence again later from the point at which it left off, as will become apparent below. Control then passes to process 46, in which simulation system 10 performs stability analysis at the current tpunch point.

Figure 4:
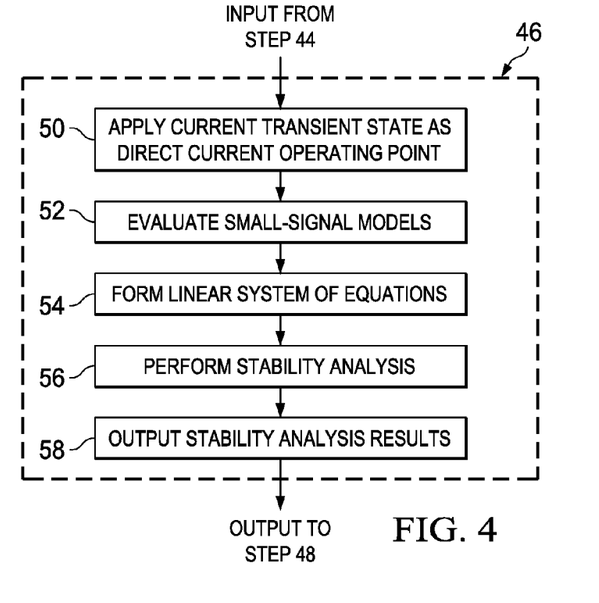
FIG. 4 is a flow diagram illustrating the operation of the simulation system of FIG. 1 in performing small-signal stability analysis, within the overall process flow of FIG. 2, according to embodiments of this invention.

As shown in FIG. 4 and as summarized above, stability analysis process 46 begins with process 50, in which the current transient state of the modeled circuit being analyzed, as computed in the most recent instance of process 40 (FIG. 2) for the current transient time point, is applied to the modeled circuit as if this state constituted a DC operating point. In other words, for purposes of stability analysis at the snapshot in time of the tpunch point, the modeled circuit is treated as if it is operating at a DC operating point defined by the solution of the system of circuit equations at the current instant in time, even though this instant in time is in actuality a transient condition. Linearized operation of the circuit about the bias conditions indicated by this current state of the circuit is thus assumed, for purposes of stability analysis process 46.

In process 52, the small signal models for the various circuit components in the modeled circuit are evaluated. As known in the art, active devices such as transistors can be represented by various parameters for purposes of small signal analysis about a DC operating point. These parameters can vary with the voltage and current levels of that DC operating point, as known in the art. Passive components (resistors, inductors, capacitors, including both explicit and parasitic types) can also be modeled as having a DC voltage or DC current dependence, and as such may also have small-signal parameters. As such, for purposes of stability analysis under the conditions determined for the current instant in time, simulation system 10 evaluates these various small signal parameters of the devices that make up the modeled circuit, at the assumed DC operating point corresponding to the evaluated state of the circuit at this instant in time, in process 52.

In process 54, a linear system of equations is created by simulation system 10, corresponding to the modeled circuit but using the small-signal model parameters as evaluated in process 52, and thus at the assumed DC operating point corresponding to the evaluated state of the circuit at this instant in time. In a general sense, the system of equations created in process 54 is based on the linearization of the circuit operation at the operating point applied in process 50 at transient time point $t_m$, for the case of an input stimulus u(t) consisting of a transient component $\bar{u}_m$ corresponding to the node voltages and branch currents solved for the circuit in process 40, and a small harmonic perturbation $\bar{u}_{AC} e^{j\omega t}$:

$$\bar{u}(t) = \bar{u}_m + \bar{u}_{AC} e^{j\omega t} \quad (7)$$

In this case, the solution vector $\bar{v}(t)$, for purposes of small-signal stability analysis, which as known in the art is a frequency domain analysis, becomes:

$$\bar{v}(t) = \bar{v}_m + \bar{v}_{AC} e^{j\omega t} \quad (8)$$

Substituting these expressions (7) and (8) into the discretized system of equations (6), and applying the small-signal approximation of first order Taylor expansion, yields the system of equations:

$$\left( \bar{G}_m + j\omega \bar{C}_m \right) \cdot \bar{v}_{AC} + \bar{u}_{AC} = 0 \text{ where} \quad (9)$$

$$\bar{G}_m = \frac{\partial \bar{i}}{\partial \bar{v}}(\bar{v}_m) \text{ and } \bar{C}_m = \frac{\partial \bar{q}}{\partial \bar{v}}(\bar{v}_m)$$

are the circuit matrices for the transient state calculated in process 40 at tpunch point $t_m$, and which express the small-signal model parameters evaluated in process 52 for the circuit being simulated.

Following the formation of the linear system of equations in process 54, simulation system 10 next performs the desired stability analysis of the modeled circuit in process 56. This stability analysis is executed at the operating point corresponding to the evaluated state of the circuit at this instant in time $t_m$, by solving the linear system formed in process 54 based on the small-signal model parameters evaluated in process 52. It is contemplated that stability analysis process 56 can be carried out according to one or more of a number of techniques, including the Middlebrook (STB) technique, for example as described in the Tian et al. article referenced above and incorporated by reference herein, including the "loop finder" stability analysis described in the Miley et al. article referenced above and incorporated by reference herein, and including the improved loop finder analysis described in copending U.S. provisional application No. 61/242,222, incorporated by reference herein.

According to one embodiment of this invention, STB stability analysis is used by simulation system 10 to execute process 56. In summary, STB stability analysis as practiced under a SPICE simulation environment begins with a user-specified "breakpoint" that completely breaks a known feedback loop. A zero-value voltage source or probe is inserted at that breakpoint, and the magnitude and phase of loop gain (i.e., return ratio, as described in the Middlebrook and Tian et al. articles incorporated herein by reference) are measured as a function of various sweeping parameters, including frequency. Typical STB stability analysis techniques in conventional SPICE simulation environments automatically compute phase and gain margins and frequencies resulting from the parameter sweeping analysis. As known in the art, phase margin is the phase difference of the loop gain from −180° at the unity gain frequency, and gain margin is the gain difference from unity at the frequency at which the loop gain exhibits a −180° phase shift. STB stability analysis provides the benefits of direct computation of loop gain, and phase and gain margins, without loading effects that are caused by conventional techniques that "break" the loop or insert resistors or filters (and thus change the operating point of the circuit). In addition, as described in the Tian et al. article, the return-loop model used in conventional STB stability analysis is bilateral, and is thus more reflective of actual circuit behavior.

As mentioned above, the "loop finder" stability analysis technique described in the Miley et al. article incorporated by reference above, analyzes the behavior of the modeled circuit by applying a small-signal (e.g., AC current) stimulus to each node of the circuit individually (i.e., with no stimulus being applied to any other node). The small-signal response is measured at that same node at which the stimulus is applied, and the stability of the circuit versus frequency is computed:

$$P(\omega) = \left( \frac{d}{d\omega} \frac{\frac{d}{d\omega} |v(\omega)| \omega}{|v(\omega)|} \right) \omega$$

where v(ω) is the voltage response as a function of frequency. This stability function P(ω) is thus defined as the second order derivative of the system response with respect to frequency, each derivative normalized to both frequency and magnitude; the real poles and zeros are effectively filtered out by this second-order differentiation, while the complex poles and zeros remain. Negative peaks in this stability function P(ω) appear at the natural frequency $\omega_0$ of each complex pole, and a stability factor or damping ratio ζ can be calculated at that natural frequency $\omega_0$. The stability function P(ω) defined above is evaluated at each node, and those nodes that share the same complex pole are considered to belong to the same loop in the modeled circuit.

The loop finder approach described in copending U.S. provisional application No. 61/242,222, incorporated by reference herein provides an efficient way of determining the dominant second-order systems directly from explicit determinations of system transfer functions at each circuit node. For the example of a current I(s) as the stimulus at a node and a voltage V(s) as the output at that node, a transfer function Z(s) can be expressed in pole-zero form as:

$$Z(s) = \frac{V(s)}{I(s)} = K \frac{(s-z_1)(s-z_2) \ldots (s-z_M)}{(s-p_1)(s-p_2) \ldots (s-p_N)}$$

with M zeros $z_i$ and N poles $p_j$. Separating the real from the complex poles, a pole-residue representation of this transfer function can be constructed:

$$Z(s) = \sum_{n=1}^{N_R} \frac{k_n}{s-p_n} + \sum_{n=1}^{N_C} \left( \frac{k_n}{s-p_n} + \frac{k_n^*}{s-p_n^*} \right)$$

where $N_R$ is the number of real poles, $N_C$ is the number of complex poles, and * indicates the complex conjugate. In practice, the residues (i.e., the complex poles, their frequencies, and their damping ratios) are computed by simulation system 10, in process 56, by way of conventional matrix operations, such as solving an eigenvalue problem by way of the well-known QZ method. The computational complexity of determining these node impedance transfer functions can thus be quite substantial, especially for large or complex circuits. It is conceivable that the number of equations involved in these operations of process 56 can reach or exceed one thousand. The transfer function $Z_n(j\omega)$ of any one of the $N_C$ complex pole pairs in the second term of the pole-residue representation can be expressed in the frequency domain as:

$$Z_n(j\omega) = \frac{k_n}{j\omega - p_n} + \frac{k_n^*}{j\omega - p_n^*}$$

from which the pole frequencies and damping ratio can be directly computed.

In practice, according to this loop finder approach, the pole frequencies exhibited by the circuit are identified at each node. The real poles and those complex poles that can be considered as relatively stable (e.g., having a stability factor, or damping ratio, ζ>0.7), are ignored. Process 56 according to this loop finder approach continues with the computation of the residues of impedance transfer functions $|Z_n(j\omega)|_{\omega=0}$ for all of the complex poles of interest (i.e., the underdamped poles) at each node, and those second-order systems with a DC impedance below a threshold value (e.g., <100 m Ω) are ignored. The remaining dominant complex poles for each node transfer function are determined in process 56, and loops in the circuit are then identified as those nodes that share the same dominant complex pole. Within each identified loop, simulation system 10 (FIG. 1) can sort the nodes by impedance. Gain and phase margins for each of these loops can then be determined by the conventional manner, for example by identifying the −180° phase shift frequency and the unity gain frequency, and from the damping factor and natural frequency of the underdamped second order systems.

Referring back to FIG. 4, upon completion of stability analysis process 56 according to either or any of the techniques described above, simulation system 10 outputs or otherwise reports the results of this stability analysis in process 58. It is contemplated that this reporting will typically include storing the results of the stability analysis in library 22 or in some other data memory resource of simulation system 10, for retrieval as desired by the user or by the remainder of the process. Stability analysis process 46 is then complete. This stability analysis result thus provides an indication of the small-signal stability of the circuit under its instantaneous transient conditions at the current tpunch point TP.

Referring back to FIG. 2, following stability analysis process 46 and the output or storing of the results of that stability analysis, control passes to process 48, in which simulation system 10 restores the simulated circuit to the state of that derived in process 40 for the current transient time point. More specifically, it is contemplated that the transient state of the circuit that was saved in process 44, following the determination of decision 43 in which stability analysis was indicated, will become the initial condition of the circuit for subsequent processing within the transient analysis simulation of this embodiment of the invention. Decision 43 is executed by simulation system 10 to determine whether another pass through stability analysis processes 44, 46, 48 is desired or necessary for the same tpunch point TP. For example, it may be useful for simulation system 10 to carry out STB analysis on the known feedback loops in a first instance of process 46, and to then apply loop finder analysis as described above in a second instance of process 46, to identify any hidden or parasitic loops that can cause instability at this current transient time point $t_m$. Indeed, multiple STB analyses using different "probe" devices (i.e., at different assumed breakpoints for different but independent feedback loops) may be performed, in addition to possibly performing loop finder analysis. As such, if another instance of stability analysis is desired (decision 43 is "yes"), those processes 44, 46, 48 are performed again under different parameters or applying a different technique. If stability analysis is complete (decision 43 is "no") and if the current transient time point is not already at the end of the interval [0, T] defined in process 34 (decision 49 is "no"), the transient analysis being carried out by simulation system 10 according to this embodiment of the invention will advance to the next transient time point in that analysis in process 42. Process 40 will then be performed to compute the solution at that new transient time point, using the conditions restored in process 48 as the initial conditions for that computation.

The process of FIG. 2 according to these embodiments of this invention continues in this manner until completion of the transient analysis interval [0, T], as determined by simulation system 10 upon decision 49 returns a "yes" result. Transient stability analysis of the circuit under simulation is then complete.

As evident from this description, embodiments of this invention not only provide transient analysis of the circuit being simulated, but also provide small-signal stability analysis at selected times during the transient response of the circuit. These embodiments of the invention thus provide the circuit designer and analyst with capability not previously available in conventional circuit or system simulation software environments, specifically the capability of determining whether the transient conditions within the circuit place the circuit into a state that is unstable, and the extent of that instability. It is therefore contemplated that this simulation method and system will enable the circuit designers to compensate or otherwise address the transient inability of actual integrated circuits to be fabricated, so that functional failure of actually manufactured circuits are avoided. Yield loss in manufacture and test can thus be avoided, and reliable performance of the circuits in their system applications can be ensured.

Figure 5A:
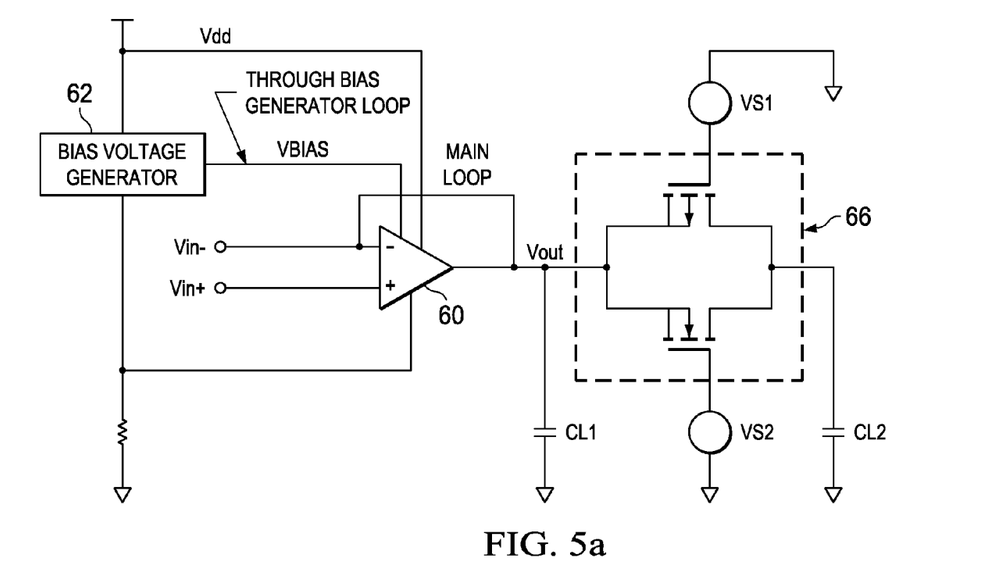
FIG. 5a is an electrical diagram, in schematic form, of an example of an electronic circuit that is simulated and analyzed according to embodiments of this invention.
Figure 5B:
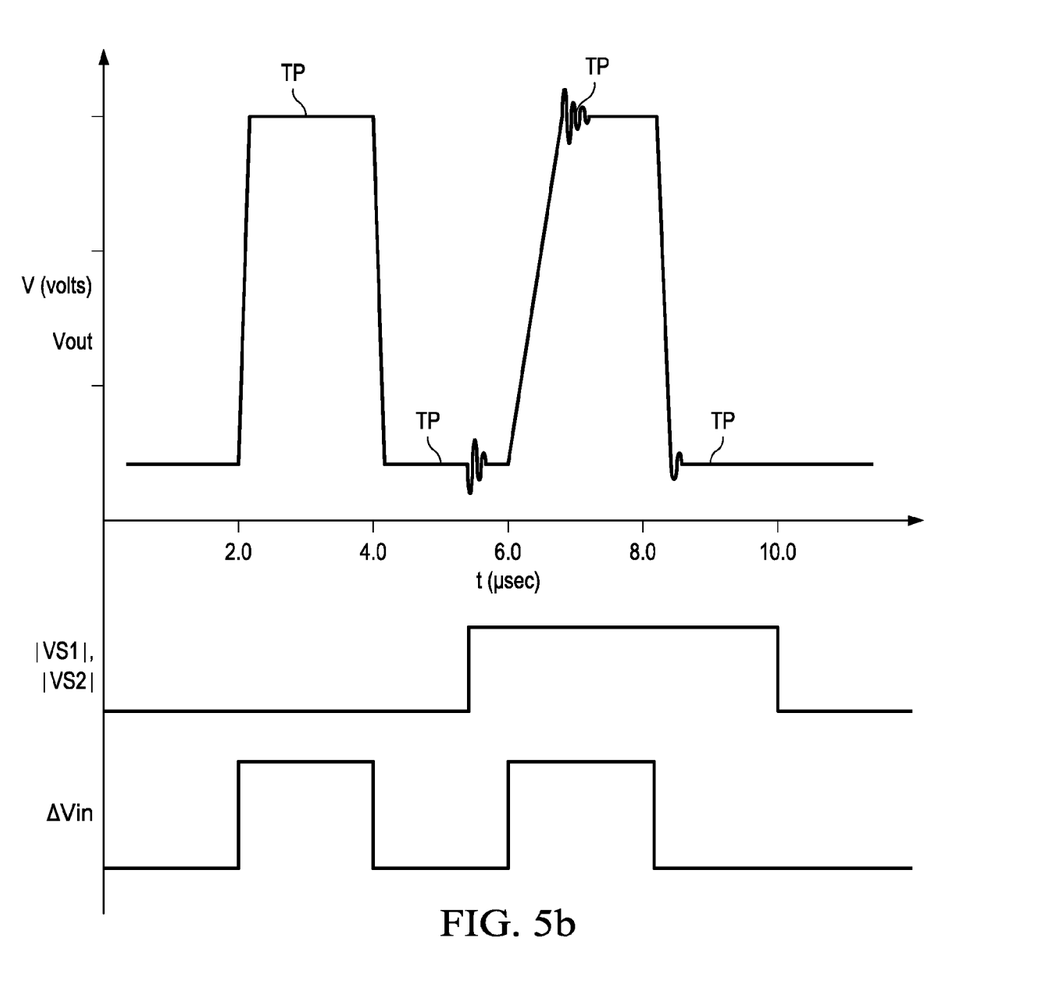
FIG. 5b is a timing diagram illustrating signals in the circuit of FIG. 5a, in connection with an example of the operation of embodiments of this invention.

Referring now to FIGS. 5a and 5b, an example of small-signal stability analysis during transient response of a simulated circuit will now be described, to illustrate an example of benefits of this invention. FIG. 5a illustrates a relatively simple amplifier circuit including two-input differential amplifier 60, which receives a differential input voltage at its positive and negative inputs (those inputs receiving input voltages Vin+ and Vin−, respectively). Load capacitor CL1 is connected to the output of amplifier 60, and amplifier 60 is biased between a $V_{dd}$ power supply voltage and ground. This load capacitor CL1 is relatively small in this example, for example about 100 fF. Bias voltage VBIAS is generated by bias voltage generator 62, and is applied to a bias input of amplifier 60 for offset adjustment, in the conventional manner. Bias voltage generator 62 in this example is arranged as a conventional current mirror circuit. Pass gate 66 is also connected to the output of amplifier 60, and includes complementary metal-oxide-semiconductor transistors with their source/drain paths in parallel with one another, in the conventional manner. Voltages VS1, VS2 control the gates of the transistors in pass gate 66, such that either both transistors are on (pass gate 66 conductive) or both are off (pass gate 66 non-conductive). Load capacitor CL2 is connected at the opposite side of pass gate 66 from the output of amplifier 60; as such, if pass gate 66 is turned on (conductive) by voltages VS1, VS2, the load at the output of amplifier 60 includes both load capacitors CL1, CL2. This load capacitor CL2 has a capacitance (e.g., 10 pF) that is substantially larger than that of load capacitor CL1, in this example. If pass gate 66 is turned off by voltages VS1, VS2, the load at the output of amplifier 60 includes only load capacitor CL1, and not load capacitor CL2.

FIG. 5b illustrates certain signals in the amplifier of FIG. 5a during the transient response of that circuit. The voltage applied across differential input terminals Vin+, Vin− is illustrated by voltage ΔVin (which equals Vin+−Vin−) in this example, which makes two positive going pulses at time t=2.0 μsec (for a duration of 2.0 μsec), and at t=6.0 μsec (for a duration of slightly longer than 2.0 μsec). The voltages VS1, VS2 controlling pass gate 66 are also shown in FIG. 5b by their absolute values; in this instance, pass gate 66 is turned on at t=5.5 μsec and remains on until about t=10.0 μsec, during which time both load capacitors CL1, CL2 are connected in parallel to the output of amplifier 60. Voltage Vout shown in FIG. 5b illustrates the voltage at the output of amplifier 60 in this example, and thus illustrates the response of amplifier 60 to the various inputs in the circuit, as generated by transient analysis simulation executed by simulation system 10.

Ringing is evident in the waveform of output voltage Vout in FIG. 5b at particular times in this example. In particular, ringing occurs shortly after pass gate 66 is turned on by voltages VS1, VS2, at t=5.5 μsec, due to the addition of load capacitor CL2 at that time by the operation of pass gate 66. Ringing also occurs at the end of the low-to-high transition of output voltage Vout after this second load capacitor CL2 is coupled to the output of amplifier 60, after about t=7.0 μsec. The effect of the additional load capacitor CL2 is evident in FIG. 5b by the slower transition time of output voltage Vout in response to the second pulse of input voltage ΔVin, relative to the transition of output voltage Vout to the first pulse of input voltage ΔVin (after t=2.0 μsec). This reflects the substantially larger capacitance of load capacitor CL2 (e.g., 10 pF) relative to that of load capacitor CL1 (e.g., 100 fF) in this example. Ringing is also evident in output voltage Vout at the end of the high-to-low transition, between t=8.0 μsec and t=9.0 μsec.

In this transient analysis example of FIG. 5b, the time interval selected by simulation system 10, in process 34, corresponds to [0.0, 10.0 μsec]; transient time points selected in process 34 include time points at least as frequent as every μsec within that interval. In process 36 according to this example, several tpunch points TP, at which small-signal stability is analyzed, are identified; as shown in FIG. 5b, these time punch points TP are at times t=3.0 μsec, 5.0 μsec, 7.0 μsec, and 9.0 μsec. As evident from FIG. 5b, the tpunch point TP at t=7.0 μsec occurs during a ringing event of output voltage Vout.

In the transient analysis simulation applied to the circuit of FIG. 5a in this example, as described above, solutions to the circuit node and branch equations are derived at each of several transient time points over the interval [0.0, 10.0 μsec] defined in process 34. At the first tpunch point TP at t=3.0 μsec, loop finder stability analysis is performed by simulation system 10 via process 46. In this example, two feedback loops were discovered and identified. One feedback loop is the "main" loop evident in FIG. 5a, as constituted by the forward path through amplifier 60 and the feedback loop from its output (Vout) back to the negative input of amplifier 60. The second feedback loop identified in this example is constituted by a loop including bias voltage generator 62 and amplifier 60 (via line VBIAS); the feedback loop within bias voltage generator 62 includes a reference leg of the feedback loop and an opposing leg of cross-coupled transistors between those legs. These two loops are characterized by their respective natural frequency $\omega_0$ and damping ratio $\zeta$:

| Loop | $\omega_0$ | $\zeta$ |
|---|---|---|
| Main loop | 11.593 MHz | 0.6881 |
| Thru bias generator 62 | 47.327 MHz | 0.7053 |

Small-signal stability analysis is next performed by an instance of process 46, in this example, at the tpunch point TP at t=5.0 μsec. At this point in the transient response, these same two feedback loops are identified and characterized by the loop finder approach:

| Loop | $\omega_0$ | $\zeta$ |
|---|---|---|
| Main loop | 12.011 MHz | 0.6883 |
| Thru bias generator 62 | 47.322 MHz | 0.7054 |

These results are very similar to those exhibited at the first tpunch point TP at 3.0 μsec.

Transient analysis at each transient time point determined in the simulation is then performed after tpunch point TP at time t=5.0 μsec. Small-signal stability analysis is next performed at the tpunch point TP at time t=7.0 μsec, using the conditions of the simulated circuit of FIG. 5a computed in process 40 at that time (processes 44, 46). As described above and as evident from FIG. 5b, this tpunch point TP is taken during a ringing event of the circuit of FIG. 5a. In this example, the results of small-signal stability analysis process 46 at time t=7.0 μsec for this circuit showed:

| Loop | $\omega_0$ | $\zeta$ |
|---|---|---|
| Thru bias generator 62 | 47.283 MHz | 0.7050 |

Remarkably, as evident from these results, the main loop of the circuit of FIG. 5a is observed to be "broken" (i.e., non-existent) during the ringing event occurring at the tpunch point TP at time t=7.0 μsec. The absence of this main loop in the circuit will, of course, be reflected in the functional behavior of the circuit at this point in its transient response. In this case, because the transient response corresponds to the response of the circuit to a pulse of the input voltage, this aberrant behavior (loss of the main feedback loop) is likely to occur during normal functional operation of the circuit, affecting its behavior. The small-signal stability analysis performed at time points within the transient analysis, according to embodiments of this invention, is thus able to identify conditions in the operation of the circuit that are not otherwise evident to the designer or analyst, or observable by way of conventional simulation environments. And as a result of this ability, the circuit designer can include the appropriate compensation or other design correction to the circuit, and can verify the effectiveness of that compensation or correction through use of embodiments of this invention.

Transient analysis of the circuit of FIG. 5a continues at each transient time point within the specified interval. At the tpunch point TP at time t=9.0 μsec, small-signal stability analysis can again be performed. In this example, the results of the loop finder analysis in this instance of process 46 executed by simulation system 10 are:

| Loop | $\omega_0$ | $\zeta$ |
|---|---|---|
| Main loop | 7.1136 MHz | 0.2417 |
| Thru bias generator 62 | 47.281 MHz | 0.7050 |

As evident from these results, the main amplifier loop has returned into the characteristic of the circuit. However, the natural frequency $\omega_0$ has changed from that at times t=3.0 μsec and t=5.0 μsec, due to the inclusion of load capacitor CL2 with pass gate 66 on, and the damping ratio C has fallen, indicating a severely under-damped response relative to the previous tpunch points TP. The circuit designer is thus made aware of this change in natural frequency and response, and can compensate the circuit as necessary to improve the damping ratio, or to improve the gain and phase margin of the circuit if operating frequencies are in the region of that natural frequency.

At each of these tpunch points TP in this example, it is also contemplated that the gain and phase margin can be readily determined as part of each instance of process 46, if desired. Other results provided by conventional small-signal stability analysis at those points in time can also be generated, and stored or otherwise output to the user or for later retrieval, as desired.

As a result of embodiments of this invention, therefore, additional insight into the operation of electronic circuits, and indeed other feedback systems, can be obtained. Specifically, embodiments of this invention provide the ability of the designer or analyst to investigate the stability of the circuit or system at specific points in time within the transient response of the circuit or system, particularly in transient conditions in which the effective operating point of the circuit is temporarily much different from that expected in steady-state operation. As such, instabilities in the operation of the circuit or system can be identified by way of simulation, and the appropriate compensation or other correction designed into the circuit or system (or enforced by way of manufacturing process limits or limitations in the system operational specifications), before the expense and effort involved in manufacture of the circuit or system. Embodiments of this invention can also be used to investigate the causes and cures for unstable behavior of actual circuits or systems under test or usage conditions, thus providing the analyst and designer with the necessary tools to properly address such failures.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of operating a computer to simulate the behavior of an electronic circuit, comprising the steps of:
retrieving a model representative of the circuit from a memory resource;
defining an initial state of the model;
selecting a transient response interval;
applying a simulated input stimulus to the model;
computing a solution of a system of equations to evaluate node voltages and branch currents in the model at a transient time point within the transient response interval;
storing the computed solution in a memory resource;
performing at least one stability analysis of the model at the transient time point, at an operating point corresponding to the computed solution at that transient time point;
retrieving the computed solution from the memory resource; and
repeating the computing step at another one of a plurality of transient time points, using the retrieved computed solution as an initial state of the model.

2. The method of claim 1, further comprising:
prior to the step of performing a stability analysis, selecting one or more user-specified time points within the transient response interval;
wherein the step of performing a stability analysis is performed at one of the user-specified time points, after the computing step has been performed at a transient time point corresponding to that user-specified time point.

3. The method of claim 2, further comprising:
selecting a plurality of user-specified time points within the transient response interval; and
repeating the step of performing a stability analysis for each of the plurality of user-specified time points.

4. The method of claim 1, wherein the step of performing at least one stability analysis comprises:
evaluating small-signal model parameters for each of a plurality of circuit elements in the model, at an operating point corresponding to the computed solution at that user-specified time point;
forming a linear system of equations using the evaluated small-signal model parameters;
executing a stability analysis routine on the linear system of equations; and
storing the results of the executing step.

5. The method of claim 4, wherein the step of executing at least one stability analysis routine comprises:
  performing an STB analysis at the user-specified time point, at the operating point corresponding to the computed solution at that user-specified time point, to compute gain margin and phase margin at that user-specified time point.

6. The method of claim 4, wherein the step of executing at least one stability analysis routine comprises:
  performing a loop finder analysis at the user-specified time point, at the operating point corresponding to the computed solution at that user-specified time point, to identify one or more loops in the circuit and dominant second-order systems exhibited at one or more nodes in those one or more loops.

7. A computer-readable medium storing a computer program that, when executed on a computer system, causes the computer system to perform a sequence of operations for simulating the behavior of an electronic circuit, the sequence of operations comprising:
  retrieving a model representative of the circuit from a memory resource accessible to the computer system;
  defining an initial state of the model;
  selecting a transient response interval;
  applying a simulated input stimulus to the model;
  computing a solution of a system of equations to evaluate node voltages and branch currents in the model at a transient time point within the transient response interval;
  storing the computed solution in a memory resource accessible to the computer system;
  performing at least one stability analysis of the model at the transient time point, at an operating point corresponding to the computed solution at that transient time point;
  retrieving the computed solution from the memory resource; and
  repeating the operation of computing a solution of a system of equations, at another one of a plurality of transient time points, using the retrieved computed solution as an initial state of the model.

8. The computer-readable medium of claim 7, wherein the plurality of operations further comprises:
  prior to the operation of performing a stability analysis, selecting one or more user-specified time points within the transient response interval;
  wherein the operation of performing a stability analysis is performed at one of the user-specified time points, after the computing step has been performed at a transient time point corresponding to that user-specified time point.

9. The computer-readable medium of claim 8, wherein the plurality of operations further comprises:
  selecting a plurality of user-specified time points within the transient response interval; and
  repeating the operation of performing a stability analysis for each of the plurality of user-specified time points.

10. The computer-readable medium of claim 7, wherein the operation of performing at least one stability analysis comprises:
  evaluating small-signal model parameters for each of a plurality of circuit elements in the model, at an operating point corresponding to the computed solution at that user-specified time point;
  forming a linear system of equations using the evaluated small-signal model parameters;
  executing a stability analysis routine on the linear system of equations; and
  storing the results of the execution of the stability analysis routine in a memory resource accessible to the system.

11. The computer-readable medium of claim 10, wherein the operation of executing at least one stability analysis routine comprises:
  performing an STB analysis at the user-specified time point, at the operating point corresponding to the computed solution at that user-specified time point, to compute gain margin and phase margin at that user-specified time point.

12. The computer-readable medium of claim 10, wherein the operation of executing at least one stability analysis routine comprises:
  performing a loop finder analysis at the user-specified time point, at the operating point corresponding to the computed solution at that user-specified time point, to identify one or more loops in the circuit and dominant second-order systems exhibited at one or more nodes in those one or more loops.

13. A simulation system, comprising:
  a memory resource;
  input and output functions for receiving inputs from and presenting communication signals to a human user;
  a central processing unit for executing program instructions; and
  program memory, coupled to the central processing unit, for storing a computer program including program instructions that, when executed by the central processing unit, cause the computer system to perform a plurality of operations for simulating the behavior of an electronic circuit, the plurality of operations comprising:
    retrieving a model representative of the circuit from the memory resource;
    defining an initial state of the model;
    selecting a transient response interval;
    applying a simulated input stimulus to the model;
    computing a solution of a system of equations to evaluate node voltages and branch currents in the model at a transient time point within the transient response interval;
    storing the computed solution in the memory resource;
    performing at least one stability analysis of the model at the transient time point, at an operating point corresponding to the computed solution at that transient time point;
    retrieving the computed solution from the memory resource; and
    repeating the operation of computing a solution of a system of equations, at another one of a plurality of transient time points, using the retrieved computed solution as an initial state of the model.

14. The system of claim 13, wherein the plurality of operations further comprises:
  prior to the operation of performing a stability analysis, selecting one or more user-specified time points within the transient response interval;
  wherein the operation of performing at least one stability analysis is performed at one of the user-specified time points, after the computing step has been performed at a transient time point corresponding to that user-specified time point.

15. The system of claim 14, wherein the plurality of operations further comprises:
  selecting a plurality of user-specified time points within the transient response interval; and
  repeating the operation of performing a stability analysis for each of the plurality of user-specified time points.

16. The system of claim 13, wherein the operation of performing at least one stability analysis comprises:
evaluating small-signal model parameters for each of a plurality of circuit elements in the model, at an operating point corresponding to the computed solution at that user-specified time point;
forming a linear system of equations using the evaluated small-signal model parameters;
executing a stability analysis routine on the linear system of equations; and
storing the results of the execution of the stability analysis routine in the memory resource.

17. The system of claim 16, wherein the operation of executing at least one stability analysis routine comprises:
performing an STB analysis at the user-specified time point, at the operating point corresponding to the computed solution at that user-specified time point, to compute gain margin and phase margin at that user-specified time point.

18. The system of claim 16, wherein the operation of executing at least one stability analysis routine comprises:
performing a loop finder analysis at the user-specified time point, at the operating point corresponding to the computed solution at that user-specified time point, to identify one or more loops in the circuit and dominant second-order systems exhibited at one or more nodes in those one or more loops.

* * * * *